US011408937B2

(12) United States Patent
Flores et al.

(10) Patent No.: US 11,408,937 B2
(45) Date of Patent: *Aug. 9, 2022

(54) ENHANCED FAULT DETECTION OF LATCHED DATA

(71) Applicant: Texas Instruments Incorporated, Dallas, TX (US)

(72) Inventors: Jose Flores, Richardson, TX (US); Rama Venkatasubramanian, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/995,855

(22) Filed: Aug. 18, 2020

(65) Prior Publication Data
US 2020/0379040 A1    Dec. 3, 2020

Related U.S. Application Data

(63) Continuation of application No. 16/252,674, filed on Jan. 20, 2019, now Pat. No. 10,782,346.

(51) Int. Cl.
*G01R 31/3177* (2006.01)
*H03K 3/037* (2006.01)
*G01R 31/317* (2006.01)
*H03K 19/21* (2006.01)

(52) U.S. Cl.
CPC ... *G01R 31/3177* (2013.01); *G01R 31/31703* (2013.01); *G01R 31/31723* (2013.01); *G01R 31/31725* (2013.01); *H03K 3/0372* (2013.01); *H03K 19/21* (2013.01)

(58) Field of Classification Search
CPC .......... G01R 31/3177; G01R 31/31723; G01R 31/31703; G01R 31/31725; H03K 3/0372; H03K 19/21
See application file for complete search history.

(56) References Cited

U.S. PATENT DOCUMENTS

| | | | |
|---|---|---|---|
| 8,604,840 B2 | 12/2013 | Ahmadi et al. | |
| 10,782,346 B2 * | 9/2020 | Flores | H03K 3/0375 |
| 2007/0033468 A1 | 2/2007 | Hilgendorf et al. | |
| 2009/0153182 A1 | 6/2009 | Yamaoka et al. | |
| 2009/0210763 A1 | 8/2009 | Eckelman et al. | |
| 2011/0006827 A1 | 1/2011 | Shimura | |
| 2011/0029829 A1 | 2/2011 | Kurimoto | |
| 2013/0307600 A1 | 11/2013 | Sato et al. | |
| 2014/0223220 A1 | 8/2014 | Guntur et al. | |
| 2016/0124043 A1 | 5/2016 | Datta et al. | |
| 2016/0380748 A1 | 12/2016 | Simpson | |
| 2018/0137283 A1 | 5/2018 | Wang et al. | |
| 2020/0233030 A1 * | 7/2020 | Flores | G01R 31/31723 |

* cited by examiner

Primary Examiner — Thien Nguyen
(74) Attorney, Agent, or Firm — Ebby Abraham; Charles A. Brill; Frank D. Cimino

(57) ABSTRACT

In described examples, a latch includes active feedback circuitry for latching input information. A comparison of logic states between input and output states at selected times can determine whether, for example, the latch has correctly retained latch data. The latch can optionally be included within a scan chain, provide asynchronous latch error notifications, and/or synchronous notifications indicating where in the scan chain a latch error occurred.

20 Claims, 3 Drawing Sheets

ENHANCED FAULT DETECTION OF LATCHED DATA

CROSS REFERENCES TO RELATED APPLICATIONS

This application is a continuation of U.S. patent application Ser. No. 16/252,674, filed Jan. 20, 2019, which is incorporated by reference in its entirety herein.

BACKGROUND

Electronic circuits are designed to include increasingly smaller design features to attain increased functionality and reduced power consumption. Such electronic circuits can be implemented as SoC (system-on-chip) designs that are implemented using VLSI (very large scale integration) technology. The relatively high levels of integration increases the complexity of testing and validating proper operation of the SoC designs. For example, scan-chains (which can be clocked to serially read values from and/or write values to serially linked scan latches) of system designs can be used to determine logic states and circuit responses to input stimulus. However, such scan chains can include hundreds of serially scanned devices, which can increase the likelihood of failures and increase the amounts of time required to determine the presence of improper operation of an SoC design.

SUMMARY

In described examples, a latch includes active feedback circuitry for latching input information. A comparison of logic states between input and output states of a latch at selected times can determine whether, for example, the latch has correctly retained latch data. The latch can optionally be included within a scan chain, asynchronously provide latch error notifications, and/or synchronously provide notifications indicating where in the scan chain a latch error occurred.

DETAILED DESCRIPTION

Figure 1:
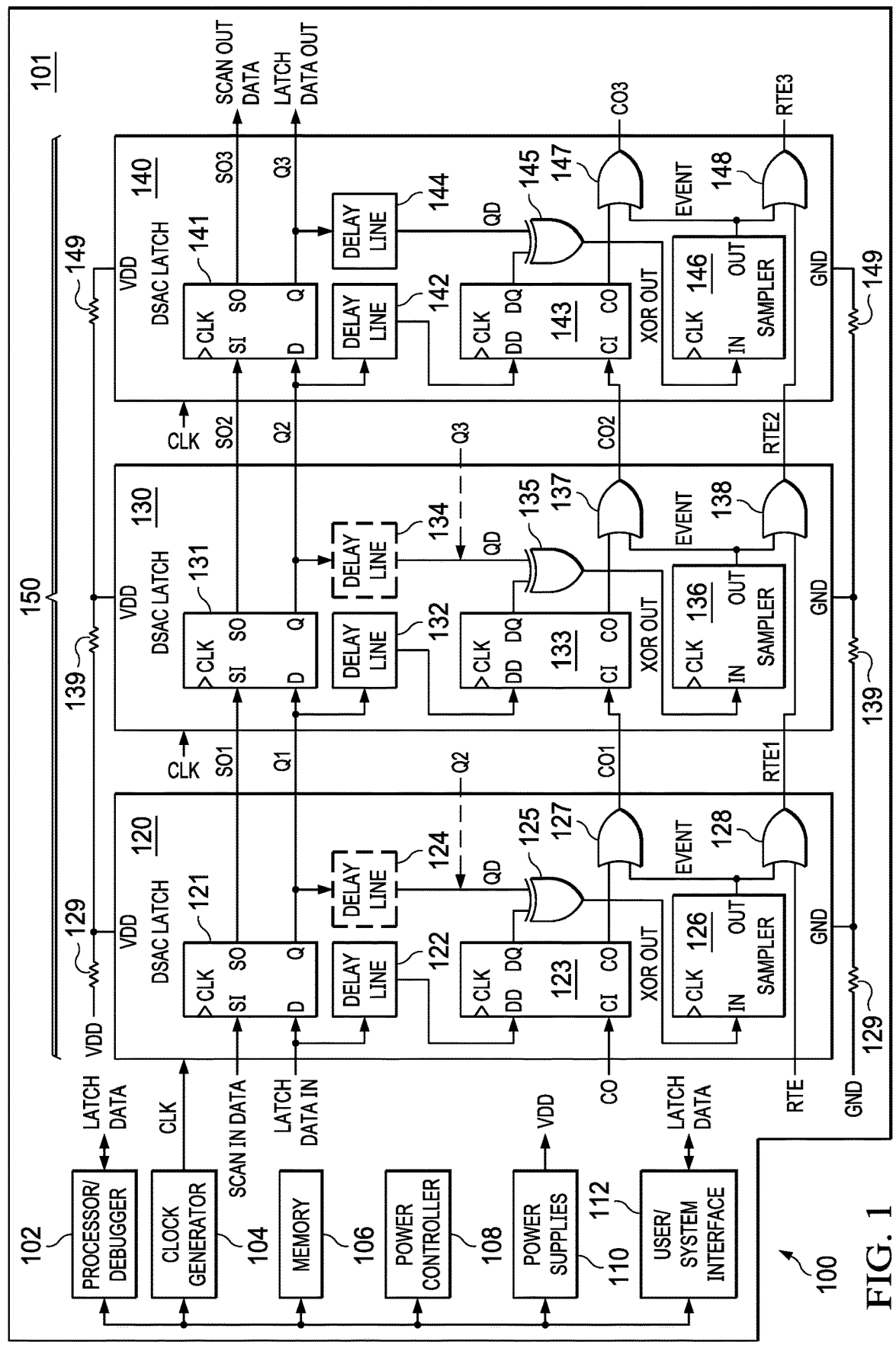
FIG. 1 is a block diagram of an example system including example data scan and compare (DSAC) latches.

Various highly integrated systems (such as SoCs—system on chips) can include circuitry (such as memory, latches, and flip-flops) for retaining logic states. The retained logic states can occur at circuit nodes that are not directly accessible via input/output terminals arranged for normal operation of a given system. In highly integrated systems, the testing, debug, and verification of such systems becomes progressively more difficult to obtain high degrees of testability as the numbers of such inaccessible nodes increase.

Scan chains (e.g., including scan chain latches) include serially coupled latches, which can be arranged to access (e.g., selectively read or write) otherwise inaccessible nodes (e.g., inaccessible logic nodes) of a circuit design. The serially coupled latches can be arranged in accordance with a serial test bus protocol by which processors/debuggers (e.g., processors and/or debuggers) and controllers can monitor, test, and control potentially large numbers of logic nodes of various systems that include at least one scan chain.

Detection of a particular fault occurring in a node of a scan chain can require serially clocking large numbers of latches (e.g., flip-flops, or "flops") in the scan chain. Serially clocking data from and through large numbers of latches can generate a bit stream in which individual bits respectively indicate a latched state of the scan latches. The bit stream can be analyzed (e.g., by comparison against test vectors generated by a functionally valid reference model for generating the bit stream), such that invalid bits in the bit stream can be identified, and such that the particular scan latches producing invalid bits can be also be identified by the position (e.g., ordinal position) of the invalid bits in the bit stream.

However, some serially coupled latches do not capture all failures (e.g., that can occur in otherwise normal operation) of the monitored nodes and, instead, can sometimes increase the potential for additional failures by increasing the complexity of a design. For example, latches (including latches of a scan latch) can be include volatile memory circuits (e.g., with active feedback circuitry), which can release a latched state (or not latch a proper state) due to signal propagation variations and/or power fluctuations (which can have differing effects upon each scan latch due to physical differences). The loss of the latched state can occur such that an improper latch state is included in the data of the scan chain being clocked in (and/or out) as a bit stream.

The power fluctuations can have disparate effects on different scan latches of a scan chain when (for example) the scan latches are operating close to voltage thresholds. The power fluctuations can produce different effects (including spurious latching) because of differences existing in the physical arrangement of various scan latches in various locations (including the disparate locations in a power grid). Such variations in the physical arrangement of the various scan latches can produce repeated or sporadically occurring errors in response to IR (e.g., voltage) fluctuations, which can vary due to different routing of power and ground connections (e.g., conductive nets) to a particular scan latch.

In examples described herein, a data scan and compare (DSAC) latch is arranged to detect errors resulting from latching dropouts and signal propagation variations. The DSAC latch includes comparison circuitry for comparing a latched input state with a delayed version of the input signal (e.g., coupled to a D input of a latch of a scan latch) to determine, for example, whether the retained latched state properly represents the state of the D-input signal asserted at the time of latching. The DSAC latch can generate an event signal indicating the presence of such an error, where the event signal can be propagated asynchronously to a processor/debugger, which can trigger an exception signal without requiring system clock delays (such as the period of time encountered while synchronously clocking data through a relatively long scan chain bit stream).

In response to the asynchronously propagated exception signal, the processor can, relatively quickly, determine the presence of an error. In response to the determination of an error, can take a remedial action (such as revert to a safe mode of operation of a system). In response to the asynchronously propagated event signal, the processor/debugger can also individually poll (e.g., via a scan chain clocked "comparison" chain, described hereinbelow) each of the DSAC latches to determine in which DSAC latch the event signal was generated (e.g., to determine which DSAC latch caused the detected error).

Each DSAC latch can also latch the results of each comparison of a latched D-input signal against a respective delayed D-input signal. When the comparison latches of the DSAC latches are arranged as a scan chain, the processor can read the comparison latch scan chain values (e.g., by generating a comparison latch scan chain bit stream in response to a system clock) and compare the comparison latch scan chain bit stream against a set of functionally valid reference model test vectors generated for testing the comparison latch scan chain bit stream. The processor can evaluate the comparison latch scan chain bit stream data to determine the location (and the associated logic state) of the error, and can take a specific action in response to the determined location of the error. The specific action can, for example, override or augment the provisional action previously taken in response to the detection of the error.

In an example automotive system, a general remedial (e.g., provisional) action can be taken, such as placing the entire system in a "safe mode" (e.g., to avoid damage to the engine and/or other systems). In contrast, a specific action (which can be selected in response to the identification of a specific latch causing the error) can be taken to mitigate specific effects of the specific latch upon systems or sensors controlled or monitored by the latch (e.g., one such specific action can be to deprecate sensor readings taken in response to circuitry controlled by the defective latch).

The DSAC latch can be implemented as a single standard cell for custom, semi-custom, and application-specific integrated circuit designs. The inclusion of instances of DSAC latches in various systems can improve the reliability of systems in which safety of operation (such as transportation systems and medical devices) is required. For example, the DSAC latch (and related scan chain) can be used in single-point-of-failure nodes in a system to increase the visibility of internal circuit operation and hasten the detection of errors (as well as hasten the actions taken in response to the detection of errors).

The DSAC latch can also be coupled to a resident debugger to enhance fault isolation capabilities, or can be coupled to a power management controller for controlling power applied to circuitry affected by erroneously latched states. The DSAC latch arranged in a comparison latch scan chain can increase the confidence in continuous proper operation of a system because of, for example, the increased types of errors reported and the relatively quickly propagated asynchronous error event reporting.

FIG. 1 is a block diagram of an example system 100 including example data scan and compare (DSAC) latches. The example system 100 includes a substrate 101 for including a processor 102, a clock generator 104, a memory 106, power controller 108, power supplies 110, a user/system interface 112, and DSAC scan latches 120, 130, and 140.

In at least one implementation, the processor 102 is arranged to execute instructions (e.g., software stored in memory 106), which, when executed by the processor 102, transform the processor 102 into a special purpose machine configured to perform at least one specific function or task. For example, the processor can execute debugging software stored in the memory 106, such that the processor 102 becomes a debugger for determining (including reading and writing) the states of the DSAC scan latches 120, 130, and 140.

The processor 102 can be microprocessor, a microcontroller, a digital signal processor (DSP), and the like. The processor 102 can also be any programmable digital module or ad hoc circuit for processing signals or data. The processor 102 is arranged to read and write selected latch data (including scan-chain data) to and from the DSAC scan latches 120, 130, and 140.

In at least one implementation, the clock generator 104 is arranged to generate (e.g., synthesize, synchronize, phase lock, multiply, divide, shape or regenerate) one or more clock signals (clocks). The clock signals can be periodic waveforms, which cycle (e.g., oscillate) at the same or different frequencies over time. The clock signals can be arranged as a clock distribution network and/or clock tree for clocking (and optionally synchronizing) components of the processor 102 and other components of the system 100. For example, the clock generator 104 is arranged to generate a clock signal CLK for clocking latch data through a scan chain 150 including each of the DSAC scan latches 120, 130, and 140 (as described hereinbelow).

In at least one implementation, the memory 106 can be volatile (e.g., losing stored information when powered-down) and/or non-volatile (e.g., retaining information when powered-down). Volatile memory can include static memory (SRAM, which can be active feedback circuitry-based) and/or dynamic RAM memory (DRAM, which can be capacitor-based). Non-volatile memory can include read-only memory (ROM), programmable read-only memory (PROM), erasable programmable read-only memory (EPROM), flash memory, hard disks, solid-state disks, CD-ROMs (e.g., including reprogrammable CD-ROMs), DVD-ROMs, "cloud" storage, memory "sticks" and/or any suitable device used for retaining information. The memory 106 can store information (e.g., code and operational data) accessed in the context of an execution environment in which one or more computer programs can implement (and/or be used by) the technology described herein. The memory 106 can be a tangible medium.

In at least one implementation, the power controller 108 can be arranged to selectively apply power to various components within system 100. The selective application of power can be determined in response to DSAC-detected errors in which such errors can result from changes in operating conditions. For example, the power controller 108 can control the power supplies 110 to change the operating voltage (VDD), for example, such that signal voltages of active feedback circuitry of latches (e.g., within scan latches) are increased to higher levels, such that signals can propagate more quickly and/or operate with improved margins over voltage thresholds (e.g., transistor gate thresholds) of the system 100. Additionally, selected components of the system 100 can be powered up (or down) when the function supplied by a selected component is needed (or no longer needed). The powering-up and powering-down of various supply voltages of the power supplies 110 can supply power on an as-needed basis to conserve power.

In at least one implementation, the power supplies 110 is arranged to supply electrical current to (and from) the DSAC scan latches 120, 130, and 140 via a power grid. The power grid can include impedances (such as impedances 129, 139, and 149) that vary in accordance with the arrangement of each of the DSAC scan latches 120, 130, and 140 with respect to the power grid. The power grid includes electrical connections of varying physical and electrical characteristics for coupling VDD and ground (GND) to each of the DSAC scan latches 120, 130, and 140.

For example, the DSAC scan latch 120 can encounter "IR drops" (e.g., voltage drops) due to electrical impedances from impedances 129, the DSAC scan latch 130 can encounter IR drops in response to electrical impedances from impedances 129 and 139, and the DSAC scan latch 140 can encounter IR drops in response to electrical impedances from impedances 129, 139, and 149. Such differing impedances can cause improper (or at least inconsistent) operation of each of the DSAC scan latches 120, 130, and 140 (described hereinbelow).

In at least one implementation, the system 100 can be controlled in response to a user and/or in response to measured system parameters received via the user/system interface 112. The user/system interface 112 can include hardware sensors and indicators for outputting information to users and other devices, and for receiving information from the user, sensors, and other devices during the execution of a software application of the system 100.

For example, the user/system interface 112 can include an input/output port for networking (e.g., providing information to and/or receiving information from) networked devices. The networked devices can include any device (including scan-chain test devices) capable of point-to-point and/or networked communications with the system 100. The networked devices can include tangible, non-transitory media (such as flash memory) and/or cabled or wireless media. These and other input and output devices can be selectively coupled (e.g., networked) to the system 100 by external devices via wireless or cabled connections.

In at least one implementation, the DSAC scan latches 120, 130, and 140 are arranged as a scan chain 150, which is coupled to the user/system interface 112. The scan chain 150 can include multiple scan chains, in which each scan chain can include respective sets of latches for generating different bit streams. For example, the scan chain 150 can include "scan in data" (SI) inputs for generating "scan out data" (SO) outputs as a bit stream, the scan chain 150 can include "latch data in" (D) inputs for generating "latch data out" (Q) outputs as a bit stream, the scan chain 150 can include "compare in" (CI) inputs for generating "comparison out" (CO) outputs as a bit stream, and the scan chain 150 can include "real-time event" (RTE) inputs for generating a chain of logical-OR functions for real-time (e.g., asynchronously) reporting of an event generated by any of the DSAC latches in the scan chain 150.

The example DSAC scan latch 120 includes a primary latch 121, an input delay line 122, a secondary latch 123, an optional output delay line 124, a comparator 125, a sampler 126, a comparison output gate 127, and a real-time event output gate 128. The example DSAC scan latch 130 includes a primary latch 131, a input delay line 132, a secondary latch 133, an optional output delay line 134, a comparator 135, a sampler 136, a comparison output gate 137, and a real-time event output gate 138. The example DSAC scan latch 140 includes a primary latch 141, a input delay line 142, a secondary latch 143, an optional output delay line 144, a comparator 145, a sampler 146, a comparison output gate 147, and a real-time event output gate 148. In the scan chain 150, the DSAC scan latches 120 and 130 "precede" the DSAC scan latch 140, whereas the DSAC scan latches 130 and 140 "succeed" the DSAC scan latch 120.

The primary latch 121 includes an SI input for receiving scan latch data (e.g., for programming and testing scan latches) from a processor 102 and/or a preceding scan latch (if any), The primary latch 121 is arranged to latch (e.g., within a first input internal latch, not shown, formed within the primary latch 121) the values received by the SI input in response to a first transition of a clock signal (e.g., a rising edge of the CLK signal) of a first clock pulse. The primary latch 121 includes an SO output for outputting data retained by the primary latch 121 in response to the input SI. For example, the retained data can be data that is latched by the first input latch internal latch and that is re-latched in a first internal output latch (not shown) in response to the falling edge of the CLK signal of the first clock pulse.

The primary latch 121 includes a D input for receiving, for example, data for conveying state information of an interior node of system 100. The D input can also be coupled to receive scan latch data from a processor 102 and/or a preceding scan latch (if any). (The primary latch 121 can be coupled to an optional multiplexor for selecting between multiple inputs.) The primary latch 121 is arranged to latch (e.g., within a second input internal latch, not shown, formed within the primary latch 121) the values received by the D input in response to a first transition of a clock signal of a first clock pulse. The primary latch 121 includes an Q output for outputting data retained by the primary latch 121 in response to the input D. For example, the retained data can be data that is latched by the second input latch internal latch and that is relatched in a second internal output latch (not shown) in response to the falling edge of the CLK signal of the first clock pulse.

Accordingly, the primary latch 121 is arranged to output a latched value (e.g., at one of the outputs SO and Q) at a time determined by internal latch propagation delays encountered in response to the first transition of the clock signal. The SO output can be coupled to an SI input of a succeeding scan latch (e.g., DSAC latch 130) via the signal S01, while the Q output can be coupled to an D input of a succeeding scan latch (e.g., DSAC latch 130) and/or an internal node of system 100 via the signal Q1.

In various applications, different arrangements of scan latches (e.g., of scan chain 150) in the power grid can result in latching errors, such as not properly latching input data, or not properly retaining (e.g., holding) the latched values. As described herein, such errors can be detected by comparing the Q output of the primary latch 121 with the DQ (delayed Q) output of the secondary latch 123. The input delay line 122 (e.g., coupled to the D input of the primary latch 121) is arranged to delay the D input signal, such that a delayed D input signal can be subsequently latched by the secondary latch 123 via the DD (delayed D) input. The secondary latch is arranged to latch the DD input in response to a transition of a clock signal (which can be the same as the clock of the primary latch 121 and/or synchronized to the clock of the primary latch 121). The latched DD input is output at the DQ output, such that a comparison can be made between the DQ output and a delayed signal generated in response to the Q output (of the primary latch 121).

The Q output lags the respective D input by an internal (e.g., D-to-Q) propagation delay triggered by (e.g., extending from) the first transition (e.g., rising edge) of the clock. In one example, the input delay line 122 can be an inverter chain with selectable input and/or output taps. The output of the input delay line 122 is coupled to the input DD (delayed D) of the secondary latch 123. The delay line 122 can be programmed by the processor 102 (or hard-wired) to generate signal delays such that secondary latch 123 does not latch the value of the D input in response to (e.g., at the time of) the first clock transition (e.g., a first rising edge) of the first clock pulse.

The delay line 122 can also be programmed by the processor 102 (or hard-wired) to generate signal delays, such that the secondary latch 123 latches—at a first transition (e.g., a rising edge) of a successive (e.g., second) clock pulse—the value of the D input that existed at the time of the first transition (e.g., a first rising edge) of the first clock pulse. The DD value is asserted at the DQ (delayed Q) output after an internal (e.g., DD-to-DQ) propagation delay triggered by the first clock transition (e.g., rising edge) of the second clock pulse.

The value of Q is subject to being changed (e.g., in normal operation) in response to the first clock transition (e.g., rising edge) of the second clock pulse (plus a propagation delay), such that the values of Q and DQ cannot (e.g., reliably) be directly compared. In a first example, the delay line 124 is arranged to provide a delay to the value of Q, such that a window of time exists in which a delayed value of Q is (e.g., during proper operation of the primary latch 121) contemporaneously the same value of DQ. In a second example, the value of Q2 (which is output by the primary latch 131 at the time of the first transition of the second clock pulse plus the local D-to-Q propagation delay) is equal to the value of DQ at the first transition of the second clock pulse plus the local DD-to-DQ propagation delay. (The D-to-Q propagation delay of the primary latch 131 and the DD-to-DQ propagation delay of the secondary latch 123 can be substantially equal when circuitry of the primary latch 131 is similar to the circuitry of the secondary latch 123.)

The comparator 125 (which can be an exclusive-OR gate) is arranged to determine whether the Q output of the primary latch 121 and the DQ output of the secondary latch have latched the same value. When the Q output of the primary latch is delayed by a complete clock cycle, the comparison between the delayed Q (output by latch 123) and DQ (output by latch 123) is valid during a sampling window that begins after the first transition (e.g., rising edge) of each clock pulse. The sampling window can be a time determined by differences in propagation times of the primary and secondary latches and setup and hold times of the latch of the sampler 126.

The sampler 126 optionally includes a programmable (or hard-wired) delay line (not shown) for delaying the first transition of a clock pulse by a selected delay. The delay is selected to determine a sampling time at which a sample of the comparison result output by the comparator 125 is valid (e.g., during the sampling window). The comparison result output by the comparator 125 is valid during a time in which the values of the output of the delay line 124 (or Q2) are (in a non-error condition) equal to each other. The delay can also be selected to choose a sampling time for accommodating setup and hold requirements of an internal input latch (not shown) in the sampler 126. (The sampling window is also described hereinbelow with respect to FIG. 2.)

In the event of an error (e.g., which is determinable when the actual latched value of Q is not equal to the "expected" value of Q, which is indicated by DQ), the sampler 126 is arranged to assert an "event" signal (e.g., for indicating a primary latch error of the associated scan latch (e.g., DSAC scan latch 120). The location of the particular scan latch in which the error occurred (or latches in which errors occurred) is detectable via the "comparison" scan chain. Latched comparison information is injected into the comparison scan chain (which includes, for example, the CO1, the CO2, and the CO3 signals) via a CO (comparison output) of a respective sampler (123, 133, or 143). The processor 102 is arranged to read the terminal node of the comparison scan chain (e.g., the CO3 signal), which when read out sequentially, errors (if any) for the scan latch 140 are indicated by the first bit read, errors for the scan latch 130 are indicated by the second bit read, and errors for the scan latch 120 are indicated by the third bit read.

Each succeeding secondary latch is arranged to convey comparison information from a preceding secondary latch in a serial manner. For example, the secondary latch 123 includes an input CI (comparison in) for reading the CO output of a preceding scan latch (if any). An internal latch is arranged to latch the value asserted at the CI input in response to a first transition of a clock pulse. Accordingly, the latched value of CI is output at the CO output after the first transition of the clock pulse. The CO output is logically ORed (via gate 128) with the event signal such that the scan latch comparison out signal (e.g., CO1) includes the indication of a local event (e.g., local error) and/or an error occurring in a preceding latch. As described hereinabove, the particular location of the error can be determined by reading the bitstream of the comparison chain and determining the position of the error within the bitstream (e.g., by the ordinal position relative to successive clock cycles). However, determining the presence of an error determined by reading and evaluating the bitstream of the comparison chain can entail numerous clock pulses (e.g., clock cycles).

The DSAC scan latches 120, 130, and 140 each includes an RTE (real-time event) input for receiving an indication an event (if any) generated by a preceding scan latch (if any). For example, the sampler 126 is arranged to assert the "event" (e.g., latch error indication) signal in response to a local primary latch (e.g., 121) error as described hereinabove. The event signal is logically ORed (via gate 128) with the input RTE signal (which for DSAC latch 130 is RET1, and for DSAC latch 140 is RTE2), to generate the scan latch output RTE output signal RTE1 (which for DSAC latch 130 is RET2, and for DSAC latch 140 is RTE3), which includes the indication of an event (e.g., error). As described hereinabove, the "OR-ing" of the respective RET signals asynchronously propagates the detection of an error, such that the reporting of the detected error is not delayed, for example, by clocking of scan chain latches and evaluation of the values output by a bitstream of the scan chain 150.

The presence of the error can be determined by monitoring the last RTE signal (e.g., RTE3) of the RTE chain. The determination of the presence of the error (which can originate from any DSAC latch in the RTE chain) can be asynchronously propagated along the RTE chain using discrete logic circuitry for rapid traversal of the RTE chain. The propagation of any event asserted in the RTE chain is not dependent on a clock (e.g., which would otherwise entail one clock cycle for traversing each and every scan latch of the RTE chain) and can (e.g., accordingly) be evaluated by a processor in a "real-time" manner, such that provisional responses to the event errors can be taken relatively quickly (e.g., in less than a few scan chain clock cycles).

Figure 2:
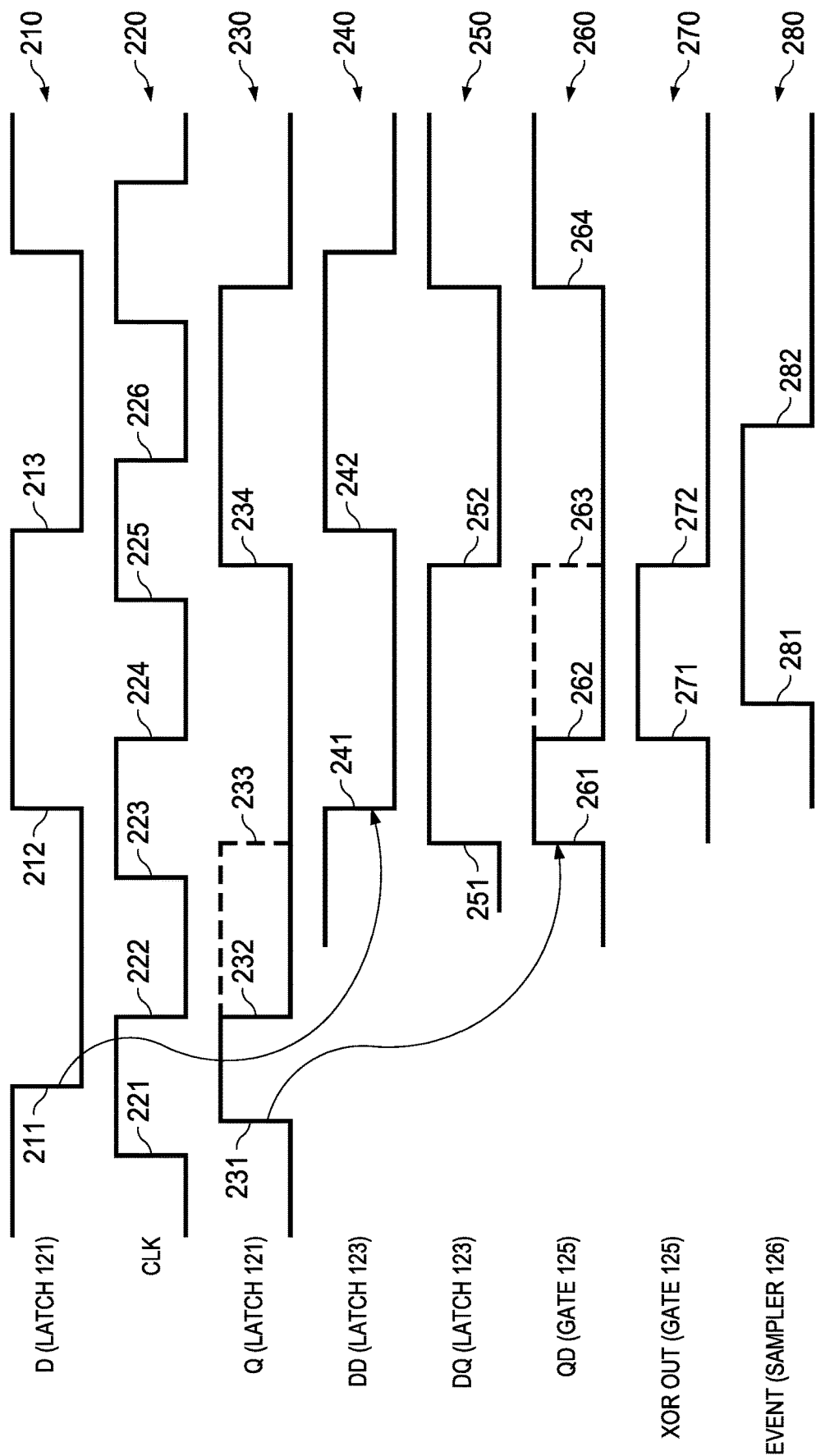
FIG. 2 is a timing diagram of operation an example DSAC latch.

FIG. 2 is a timing diagram of operation an example DSAC latch. The diagram 200 includes, for example, waveforms of an example operation of the DSAC latch 120, described hereinabove with reference to FIG. 1. The example waveforms include the waveform 210 (of the D input of latch 121), waveform 220 (of the clock signal), waveform 230 (of the Q output of latch 121), waveform 240 (of the DD input of latch 123), waveform 250 (of the DQ output of latch 123), waveform 260 (of the QD input of gate 125), waveform 270 (of the XOR output of gate 125), and waveform 270 (of the event output of sampler 126).

In an example scenario for illustrating latch 121 error detection, the waveform 210 includes alternating binary values (e.g., which alternate every clock cycle of waveform 220) for input at the D input of the latch 121. For example, a logic one is asserted before the transition 211, a logic zero is asserted the before the transition 212, and a logic one is asserted before the transition 213.

At transition 221, the latch 121 is arranged to latch the present value of the latch 121 D input (which, for example, is presently a logic one). After a D-to-Q propagation delay, the waveform 230 indicates the assertion of the latched value at the Q output at transition 231.

In the example scenario, marginal operating conditions at the transition 222 cause the latch 121 to erroneously lose the latched state, such that the latch 121 outputs an erroneous value at the transition 232. In contrast, under proper operating conditions, the latch 121 would have output the correct value at the Q output at least until the (hypothetical) transition 233. In response to a subsequent clock cycle (e.g., at transition 223), the latch 121 inputs the present value of the latch 121 D input (which, for example, is presently a logic zero) and outputs the subsequent latched value latched in response to the transition 223.

The waveform 240 is the waveform 210 (D) delayed by the delay line 122, which preserves the value to be (correctly) latched by the latch 121. For example, the transition 211 is replicated (and delayed) as transition 241, and the transition 212 is replicated (and delayed) as transition 242. The waveform 240 is coupled to the DD (delayed D) input of latch 123, and as such, the value of the DD input that is present at the clock transition 223 is latched by the latch 123.

After a DD-to-DQ (delayed Q) propagation delay (in latch 123), the waveform 250 indicates the assertion of the just-latched value (e.g., logic one) at the DQ output of latch 123 at transition 251. The latch 123 latches (in response to clock transition 225) a subsequent DD value (e.g., logic zero) and outputs the subsequent DD value (e.g., logic zero) at the DQ output at transition 252.

The waveform 260 (Q delayed, or QD) is the waveform 230 (Q output of latch 121) delayed by the optional delay line 124, for example. For example, the transition 231 is replicated (and delayed) as transition 261, the erroneous transition 232 is replicated (and delayed) as transition 232, the (hypothetical) transition 233 is replicated as transition 263, and the next correct transition 234 is replicated as transition 264. The waveform 240 is coupled to the DD (delayed D) input of latch 123, such that the value of the DD input (e.g., logic one) present at the clock transition 223 is latched by the latch 123 and is output by the latch 123 as signal QD (Q delayed) at transition 261.

Because waveform 260 (signal QD) is a delayed replica of waveform 230, the waveform 260 includes the erroneous transition 262. Gate 125 is a comparator arranged to compare the waveform 250 (which is a correct representation of the value that the latch 121 otherwise would have latched and retained) against the waveform 260 (which includes the retention error hypothesized for latch 121). Gate 125 is arrange to output (e.g., continuously assert) the results of the comparisons as waveform 270 (XOR OUT, in which the relatively small propagation delays of gate 125 are not shown, for example, for the purpose of clarity). Accordingly, waveform 270 includes a first transition 271 (which indicates the start of the determination of an error) and a second transition 272 (which indicates the ending of the determination of an error). The first transition 271 is associated with the erroneous transition 262, in the second transition 272 is associated with the transition 263 (which would have otherwise occurred at transition 232 in the absence of an error in the latch 121).

Because "glitches" can be present in the waveform 270 (e.g., due to marginal operating condition, variations in propagation delays of the inputs to the gate 125, and/or variations power supplied over the power grid), the sampler 126 is arranged to sample the waveform 270 at a time in a sampling window, which is synchronized to (e.g., sampled in response to) the clock waveform 120. For example, the transition 281 can be respectively generated in response to the clock transition 123 (a rising edge) or the clock transition 124 (a falling edge): when the rising edge is used, a programmable delay line can be used to empirically determine a sampling time; and when the falling edge is used, sampling can be performed without additional delay. The transition 282 can similarly be generated.

After the transition 272, the waveform 270 indicates no further detected errors (e.g., by maintaining a logic zero). The sampler 126 samples the waveform 270 (e.g., in response to the clock transition 226) and outputs a logic zero indicating no errors have been detected.

As described hereinabove, the event signal error notification can be introduced (e.g., "injected") into a logical-OR signal chain (e.g., as a "wired-OR" chain), such that a processor (or other supervisory device) can relatively rapidly determine the presence of an error (e.g., without requiring the reading out of scan chain values) by monitoring the value terminal node of the logical-OR signal chain. For example, the terminal node of the logical-OR signal chain can be coupled to the processor to generate an exception (e.g., interrupt).

The location of the error (e.g., the identification of the particular scan latch in which the error occurred) can be determined by evaluating bit values of the "comparison out" scan chain. Where bit values are not correct with respect to a reference model, for example, the locations of the errors causing the incorrect bit values can be determined in response to evaluating the ordinality of the erroneous bits in the bitstream (e.g., each clock cycle can be associated with a respective scan latch).

Figure 3:
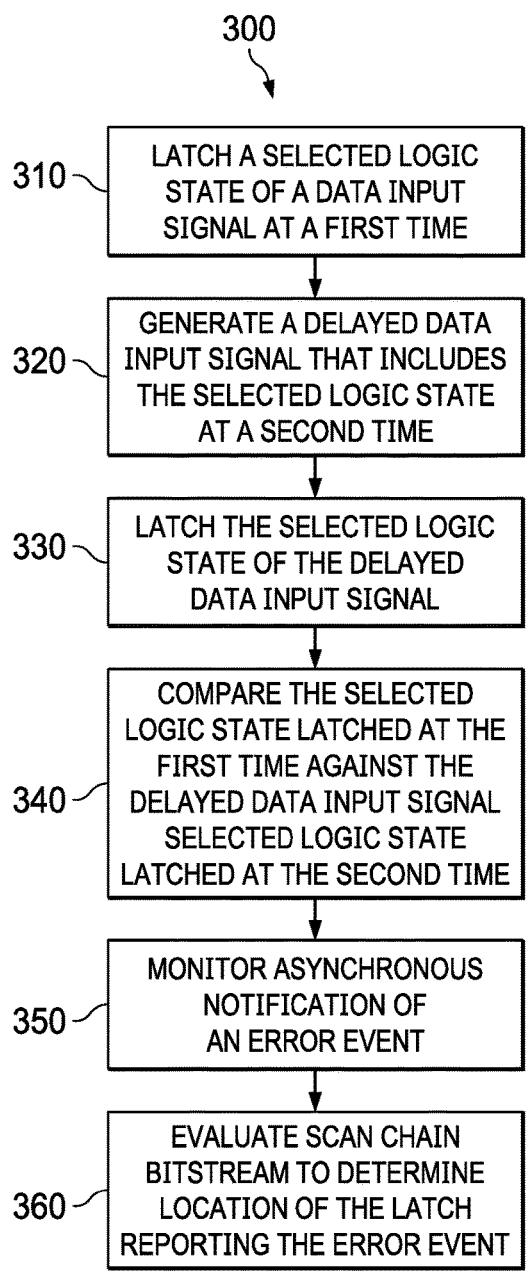
FIG. 3 is a flow diagram of an example process for enhanced fault detection of latched data.

FIG. 3 is a flow diagram of an example process for enhanced fault detection of latched data. The process 300 can be initiated at block 310. In the block 310, a selected logic state of a data input signal is latched at a first time. For example, the selected logic state can be selected, and latched, by a scan latch in response to a clock signal for propagating data through a scan chain, which includes the scan latch. A first data output signal is generated by the scan latch in response to the latched selected logic state of the data input signal. The first data output signal includes an indication of the latched selected logic state of the data input signal.

In a block 320, a delayed data input signal is generated by the scan latch in response to the data input signal. The delayed data input signal includes the selected logic state at a second time delayed from the first time. For example, the delayed data input signal can be a delayed replica (e.g., delayed waveform) of the data input signal.

In a block 330, the selected logic state of the delayed data input signal is latched by a second latch of the scan latch. A second data output signal (e.g., internal to the scan latch) is generated in response to the latched selected logic state of the delayed data input signal. The second data output signal includes an indication of the latched selected logic state of the delayed data input signal. For example, the indication of the latched selected logic state of the delayed data input signal is the same logic state as the logic state of the first data output signal that is output by the scan latch in the event the selected logic state of the data input signal is correctly latched and retained by the scan latch.

In a block 340, a difference event indication is generated in response to a difference between the indication of the latched selected logic state of the data input signal and the indication of the latched selected logic state of the delayed data input signal. For example, the difference event indication is generated (e.g., asserted) in the event the selected logic state of the data input signal is not correctly latched and/or retained by the scan latch.

In a block 350, an event signal is generated in response to the difference event indication. For example, the event signal can be asynchronously propagated along a scan chain that includes the scan latch. A processor can monitor a terminal node of a circuit for asynchronously propagating the event signal along the scan chain to receive an asynchronous notification of the latching error (e.g., which caused the event signal to be generated). A processor coupled to receive the event signal can take a general action (e.g., such as logging the presence of an error, before determining in which latch the latching error occurred).

In a block 360, a scan chain bitstream is synchronously propagated along a scan chain in which the scan latch is included. For example, a scan chain signal that includes the difference event indication of the scan latch can be synchronously propagated in response to a scan chain clock. The processor can take a specific action in response to evaluating the scan chain signal to determine in which scan latch the event signal is originated.

Figure 4:
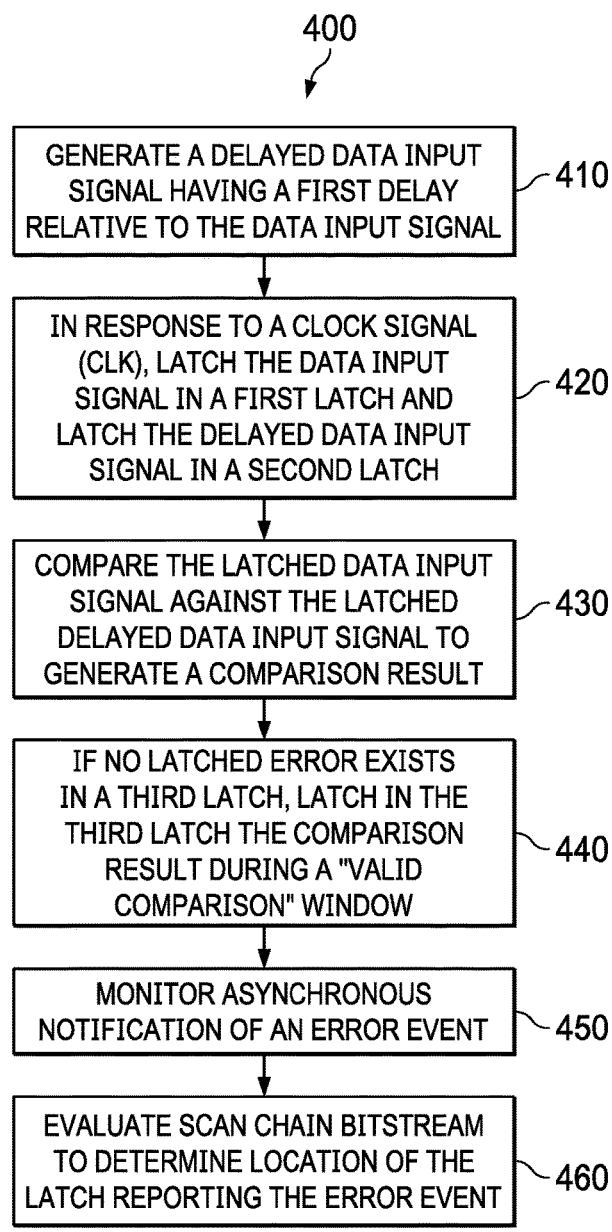
FIG. 4 is a flow diagram of another example process for enhanced fault detection of latched data.

FIG. 4 is a flow diagram of another example process for enhanced fault detection of latched data. The process 400 can be used, for example, to determine setup and/or hold violations of an input signal (such as the "scan in data signal" coupled to the SI terminal of the latch 121). In an example, the input signal can data input signal can be delayed by a selected delay to generate a delayed replica (e.g., delayed waveform) of the data input signal. In an example in which the selected delay is a fraction (e.g., less than half) of the clock cycle of the scan chain, the delay line 124 for delaying the Q output of the latch 121 can be omitted and the Q output can be connected (or otherwise coupled) to the QD input of the comparator 125. As described hereinbelow, a valid comparison result of the process 400 is generated at a time earlier (e.g., with respect to point in time within a given clock cycle) than a valid comparison result generated by the process 300.

The process 400 can be initiated at block 410. In the block 410, a delayed data input signal is generated by the scan latch in response to the data input signal. The delayed data input signal includes the selected logic state at a second time delayed from the first time. For example, the delayed data input signal can be a delayed replica (e.g., delayed waveform) of the data input signal.

The length of the delay (e.g., by how long the data input signal is to be delayed) can be selected, for example, to determine whether a selected data input signal meets a setup time for latching. In one example, the delay can be progressively selected over a range of percentages of the length of the setup time. The range of percentages can be varied (e.g., by using a programmable delay line) to determine a minimum time by which a data input signal logic state transition arrives before the minimum setup time before the arrival of an active edge of the clock signal. If the data input signal arrives precisely at the minimum setup requirement time and the selected delay is 100 percent of the minimum setup time, the delayed data input signal (e.g., the delayed replica signal) will not meet the setup requirements for latching, so that an erroneous value for the delayed data input signal is latched.

In the block 420, a logic state of the data input signal is latched in a first latch in response to a clock signal (e.g., scan chain clock signal), and a logic state of the delayed data input signal is latched in a second latch in response to the clock signal. When, for example, the delayed data input signal includes a transition of logic state that does not properly meet the setup requirements of the second latch (where the second latch is selected to have the same architecture and/or operating characteristics of the first latch), a mutually different logic state is latched by the first and second latches.

In a block 430, the latched logic state of the first latch (e.g., the latched data input signal) is compared against the latched logic state of the second latch (e.g., the latched delayed data input signal). For example, an exclusive-OR (XOR) gate can receive the latched data input signal logic state and the latched delayed data input signal logic signals at respective inputs of the XOR gate. In response to the respective inputs, the XOR gate can generate a comparison result.

In a block 440, a determination is made whether a previous comparison result has indicated an error, and, if no such error indication exists, the comparison result (e.g., the output of the XOR gate) is latched in a third latch (e.g., a comparison results sampler latch). The comparison result is latched during a window of time in which the comparison result is valid. The comparison result can be latched in the third latch in response to a delayed clock signal (e.g., that is generated in response to the clock signal for clocking the first and second latches). The delayed clock signal is delayed to include an active edge that occurs during the valid comparison window.

For example, the propagation delays of the first and second latches (e.g., the propagation delay of the latch having the longer delay) and the propagation of the XOR gate can be used to determine the start of the valid comparison window (e.g., relative to the active edge of the clock signal). The end of the valid comparison window can be determined by the architecture of the first and second latches: in one example, the end of the valid comparison window can be the next opposite edge of a given active edge of the clock signal. The delay of the delayed clock can be selected such that the active edge of the delayed clock occurs within the valid comparison window.

In a block 450, an event signal is generated in response to a difference event, which is indicated by the output of the third latch. For example, an asynchronous event signal can be generated in response to the output of the third latch and/or in response to an output of an another instance of the third latch (which can be arranged to monitor another data input signal). The asynchronous event signal can be generated in response to a logical-OR operation of the output of a given instance of the third latch and the output of a previous logical-OR operation associated with the output of a previous instance of the third latch. The results of the chained logical-OR operations are asynchronously propagated along a scan chain (e.g., parallel to a scan chain of scan latches) that includes the given instance of the third latch.

A processor can monitor a terminal node of a circuit for asynchronously propagating the event signal along the scan chain to receive an asynchronous notification of the latching error (e.g., which caused the event signal to be generated). A processor coupled to receive the event signal can take a general action (e.g., such as logging the presence of an error, before determining in which latch the latching error occurred). Another such general action can include clearing the error condition by coupling an asynchronous clear signal to an asynchronous terminal (e.g., pin) of the third latch (e.g., the comparison results sampler latch).

In a block 460, a scan chain bitstream is synchronously propagated along a scan chain in which the scan latch is included. For example, a scan chain signal that includes the difference event indication of the scan latch can be synchronously propagated in response to a scan chain clock. The processor can take a specific action in response to evaluating the scan chain signal to determine in which scan latch the event signal is originated.

The process 400 can be iterated using varying delays for delaying the delayed data input signal. For example, the arrival of a transition of the data input signal with respect to a setup time for the first latch can be determined in response to identifying a minimum delay at which latching errors occur (longer delays than the minimum delay at which latching errors occur cause errors because the setup times for the delayed data input signal are even more greatly violated as the delay is increased). The iterated process can include starting with little (or no) delay and, for each successive iteration, delay for delaying the data input signal is incrementally increased. The loop of iterations can be continued until the asynchronous notification of an error event is received (which indicates the setup time has been violated, and more particularly, the setup time that corresponds to the delay at which the latching error starts to occur).

The process 400 can be used to measure setup time performance of a "critical path" signal, or a safety-related signal to determine the margins of arrival times of the transitions of the such signals. The iteration of the process 400 can be performed during normal operation of a system when a separate (e.g., independent of the first latch) scan chain is provided for programming the programmable delay line for programming the delay for delaying the data input signal. Accordingly, the propagation of safety-critical signals can be monitored during normal operation (e.g., while not exclusively operating in a test mode).

Modifications are possible in the described examples, and other examples are possible, within the scope of the claims.

What is claimed is:

1. An apparatus, comprising:
    a first latch configured to:
    latch, at a first time, a state of a data input signal; and
    generate a first data output signal based on the latched state of the data input signal;
    a delay generator coupled to the first latch, the delay generator configured to delay the first data output signal;
a second latch coupled to the delayed generator, the second latch configured to:
    latch, at a second time, the state of the delayed first data output signal; and
generate a second data output signal based on the latched state of the delayed first data output signal; and
a comparator coupled to the first latch and the second latch, the comparator configured to generate an indication in response to the first data output signal and the second data output signal.

2. The apparatus of claim 1, wherein the delay generator is a first delay generator, and
    further comprising a second delay generator coupled to receive the first data output signal and to generate a delayed first data output signal, wherein the comparator is coupled to receive the delayed first data output signal and to generate the difference event indication.

3. The apparatus of claim 2, further comprising a sampler coupled to latch the difference event indication at the first time as indicated by a clock signal and to generate a sampled event output signal, wherein the comparator is coupled to receive the sampled event output signal to generate the difference event indication.

4. The apparatus of claim 2, wherein the clock signal is a scan chain clock signal for clocking data through a chain of scan latches, wherein the scan latch is a first scan latch, and wherein the first scan latch is for receiving clocked scan chain data from a preceding scan latch and for sending clocked scan chain data to a succeeding scan latch.

5. The apparatus of claim 4, wherein the first scan latch is coupled to receive a preceding scan latch difference event indication and to asynchronously generate a first scan latch event output signal in response to the first scan latch difference event indication and a preceding scan latch difference event indication.

6. The apparatus of claim 5, comprising the preceding scan latch and the succeeding scan latch.

7. The apparatus of claim 6, wherein the succeeding scan latch is coupled to receive the first scan latch difference event indication and to arranged to asynchronously generate a succeeding scan latch event output signal in response to the first scan latch difference event indication.

8. The apparatus of claim 6, wherein the preceding scan latch comprises a comparator for generating a preceding scan latch difference event indication in response to a logic state difference between an indication of a latched selected logic state of a preceding scan latch delayed data input signal and a logic state of a preceding scan latch data output signal for indicating a latched state of the preceding scan latch.

9. The apparatus of claim 8, wherein the first scan latch comprises a third latch for latching the preceding scan latch difference event indication, and wherein the first scan latch is arranged to generate a first scan latch comparison out signal in response to the latched preceding scan latch difference event indication and the first scan latch difference event indication.

10. The apparatus of claim 9, wherein the succeeding scan latch is arranged to asynchronously generate a succeeding scan latch event output signal in response to the first scan latch difference event indication.

11. The apparatus of claim 1, further comprises a succeeding scan latch, wherein the succeeding scan latch comprises a succeeding scan latch delay generator for generating a first scan latch delayed first data output signal in response to the first scan latch first data output signal, wherein the first scan latch comparator is arranged to generate the first scan latch difference event indication in response to the first scan latch delayed first data output signal.

12. The apparatus of claim 1, wherein the first time is the same time as the second time.

13. A system, comprising:
    a first scan latch configured to generate a first event indication in response to a difference between a latched state of a first scan latch delayed data input signal and a latched state of the first scan latch;
    a second scan latch configured to generate a second event indication in response to a difference between a latched state of a second scan latch delayed data input signal and a latched state of a second scan latch output signal, wherein the first scan latch and the second scan latch are arranged as a scan chain,
wherein the first and second scan latches are arranged to propagate an event signal in response to the first even indication and the second event indication.

14. The system of claim 13, further comprising a processor for taking action in response to the event signal.

15. The system of claim 14, wherein the action includes evaluating the comparison signal synchronously propagated in response to the scan chain clock to determine in which scan latch the event signal is generated.

16. The circuit of claim 14, further comprising a power controller, wherein a voltage control output of the power controller is changed in response to the event signal.

17. The circuit of claim 16, further comprising a user interface for providing, in response to the event signal, an indication of the generation of a first scan latch difference event indication or a second scan latch difference event indication.

18. A method, comprising:
- latching, at a first time in a first latch, a logic state of a data input signal;
- generating a first data output signal based on the latched logic state of the data input signal;
- delaying the data input signal;
- latching, at a second time in a second latch, a logic state of the delayed data input signal;
- generating a second data output signal based on the latched logic state of the delayed data input signal; and
- generating an indication in response to the first data output signal and the second data output signal.

19. The method of claim 18, further comprising asynchronously propagating along a scan chain an event signal generated in response to the difference event indication.

20. The method of claim 19, further comprising synchronously propagating along a scan chain, in response to a scan chain clock, a scan chain signal for indicating in which scan latch the event signal is originated.

* * * * *